(12) United States Patent
Shin

(10) Patent No.: US 7,071,735 B2
(45) Date of Patent: Jul. 4, 2006

(54) LEVEL SHIFTER AND PANEL DISPLAY USING THE SAME

(75) Inventor: Dong-Yong Shin, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 0 days.

(21) Appl. No.: 11/107,112

(22) Filed: Apr. 14, 2005

(65) Prior Publication Data

US 2005/0242837 A1 Nov. 3, 2005

(30) Foreign Application Priority Data

Apr. 29, 2004 (KR) ............... 10-2004-0029943

(51) Int. Cl.
*H03K 19/0175* (2006.01)
(52) U.S. Cl. .......................... 326/81; 326/68
(58) Field of Classification Search ............ 326/80–81, 326/68
See application file for complete search history.

(56) References Cited

U.S. PATENT DOCUMENTS 4,129,794 A * 12/1978 Dickson et al. .............. 326/88
5,694,061 A * 12/1997 Morosawa et al. ......... 326/119
6,259,299 B1 * 7/2001 Ryu ........................... 327/333

FOREIGN PATENT DOCUMENTS

JP 2-125525 5/1990
KR 2000-0020964 4/2000

OTHER PUBLICATIONS

Patent Abstracts of Japan for Publication number 02-125525, Date Of publication of application May 14, 1990, in the name of Takeo Fujii.
Korean Patent Abstracts for Publication number 1020000020964, Date of publication pf application Apr. 15, 2000, in the name of In Hyo Ryu.

* cited by examiner

*Primary Examiner*—James H. Cho
(74) *Attorney, Agent, or Firm*—Christie, Parker and Hale, LLP

(57) ABSTRACT

A level shifter and flat panel display using the level shifter. The level shifter for receiving an input signal alternately having first and second-level voltages, and for generating third and fourth-level voltages according to the first and the second-level voltages includes a first transistor coupled between a first power source and an output terminal, a second transistor coupled between the output terminal and a second power source, a capacitor coupled between the first transistor and a gate of the second transistor, and a switch for applying a voltage corresponding to the first-level voltage to the gate of the first transistor and for blocking the input signal to the gate of the first transistor.

26 Claims, 10 Drawing Sheets

LEVEL SHIFTER AND PANEL DISPLAY USING THE SAME

CROSS REFERENCE TO RELATED APPLICATION

This application claims priority to and the benefit of Korean Patent Application No. 10-2004-0029943 filed on Apr. 29, 2004 in the Korean Intellectual Property Office, the entire content of which is incorporated herein by reference.

BACKGROUND OF THE INVENTION (a) Field of the Invention

The present invention relates to a level shifter and a display using the same. More specifically, the present invention relates to a level shifter of which power efficiency is increased and a flat panel display using the same.

(b) Description of the Related Art

FIG. 1 shows a circuit diagram for representing a conventional level shifter. The conventional level shifter includes positive-channel metal oxide semiconductor (PMOS) transistors M1A, M2A, and negative-channel metal oxide semiconductor (NMOS) transistors M3A, M4A. The transistors M1A, M2A are cross-connected. An input voltage Vin is applied to a gate of the transistor M3A. An inverted voltage Vinb of the input voltage Vin is applied to a gate of the transistor M4A.

In the conventional level shifter, a voltage level of output signal Vout is varied according to the variation in values of the input voltages Vin, Vinb applied to the gates of the transistors M3A, M4A, and therefore it has been a problem that the conventional transistor is sensitive to skew of the input voltages Vin, Vinb.

FIG. 2 shows a circuit diagram for representing another conventional level shifter. The level shifter shown in FIG. 2 is different from the level shifter shown in FIG. 1 in that a transistor M1B of the level shifter shown in FIG. 2 is diode-connected and a gate of the transistor M1B is coupled to a gate of a transistor M2B of the level shifter shown in FIG. 2.

In the level shifter shown in FIG. 2, it has been a problem that a path of a static current flow is generated from a power source LVDD to a power source VSS while an output voltage is output according to an input voltage. Accordingly, power consumption of the level shifter is problematically increased.

SUMMARY OF THE INVENTION

In accordance with the present invention, a level shifter is provided for preventing an output signal from being affected by skew generated between input signals and having less power consumption.

Also in accordance with the present invention, a flat-panel display using a level shifter which is not affected by skew generated between input signals, and using a level shifter which has low power consumption, is provided.

In one aspect of the present invention, a level shifter receives an input signal alternately having a first-level voltage and a second-level voltage, and generates a third-level voltage and a fourth-level voltage according to the first-level voltage and the second-level voltage. The level shifter includes a first transistor coupled between a first power source and an output terminal; a second transistor coupled between the output terminal and a second power source, in which an inverted signal of the input signal is applied to a gate; a capacitor coupled between the first transistor and the gate of the second transistor; and a switch for applying a voltage corresponding to the first-level voltage to the gate of the first transistor by responding to the first-level voltage and for blocking the input signal to the gate of the first transistor by responding to the second-level voltage.

In another aspect of the present invention, a level shifter receives an input signal alternately having a first-level voltage and a second-level voltage, and generates a third-level voltage and, a fourth-level voltage according to the first-level voltage and the second-level voltage. The level shifter includes a first transistor coupled between a first power source and an output terminal, in which an inverted signal of the input signal is applied to a gate; a second transistor coupled between the output terminal and a second power source; a capacitor coupled between the first transistor and the gate of the second transistor; and a switch for blocking the input signal to the gate of the second transistor by responding to the first-level voltage, and for applying a voltage corresponding to the second-level voltage to the gate of the second transistor by responding to the second-level voltage.

In a further aspect of the present invention, a level shifter receives an input signal alternately having a first-level voltage and a second-level voltage, and generates a third-level voltage and a fourth-level voltage according to the first-level voltage and the second-level voltage. The level shifter includes a first transistor coupled between a first power source and an output terminal; a second transistor coupled between the output terminal and a second power source, in which the input signal is applied to a gate; a capacitor coupled between the first transistor and the gate of the second transistor; and a switch coupled between a third power source and the gate of the first transistor, for applying a voltage corresponding to the voltage of the third power source to the gate of the first transistor when the input signal is the first-level voltage, and for blocking the third power source to the gate of the first transistor when the input signal is the second-level voltage.

DETAILED DESCRIPTION

A level shifter according to a first exemplary embodiment of the present invention will be described with reference to FIG. 3 and FIG. 4.

Figure 1:
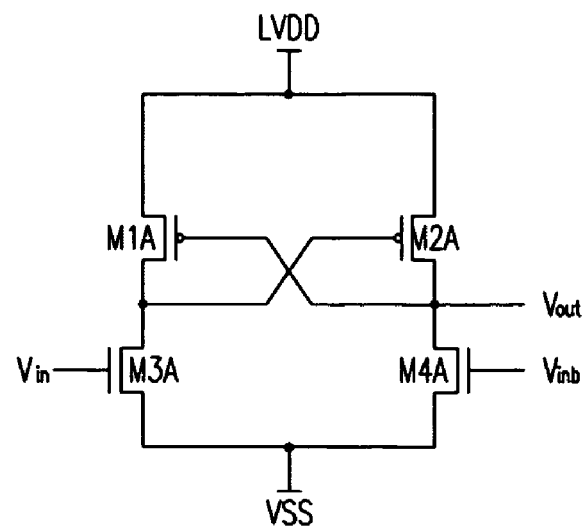
FIG. 1 shows a circuit diagram for representing a conventional level shifter.
Figure 2:
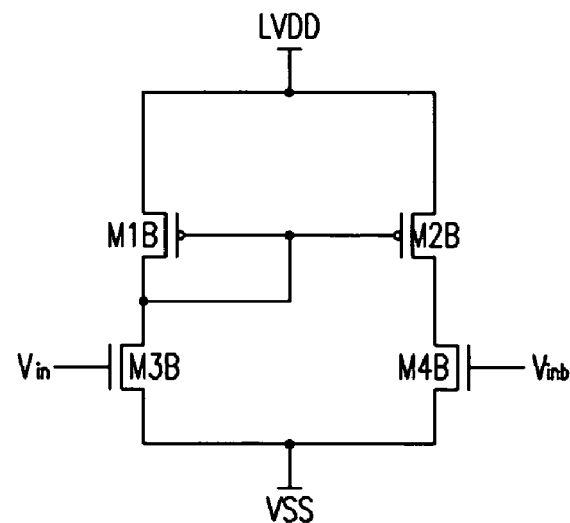
FIG. 2 shows a circuit diagram for representing another conventional level shifter.
Figure 3:
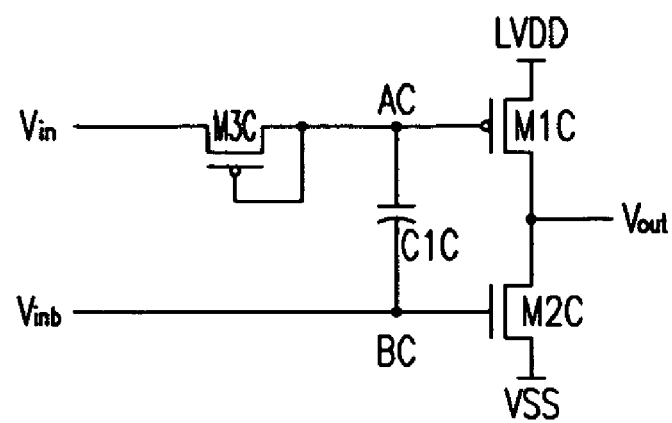
FIG. 3 shows a circuit diagram for representing a level shifter according to a first exemplary embodiment of the present invention.
Figure 4:
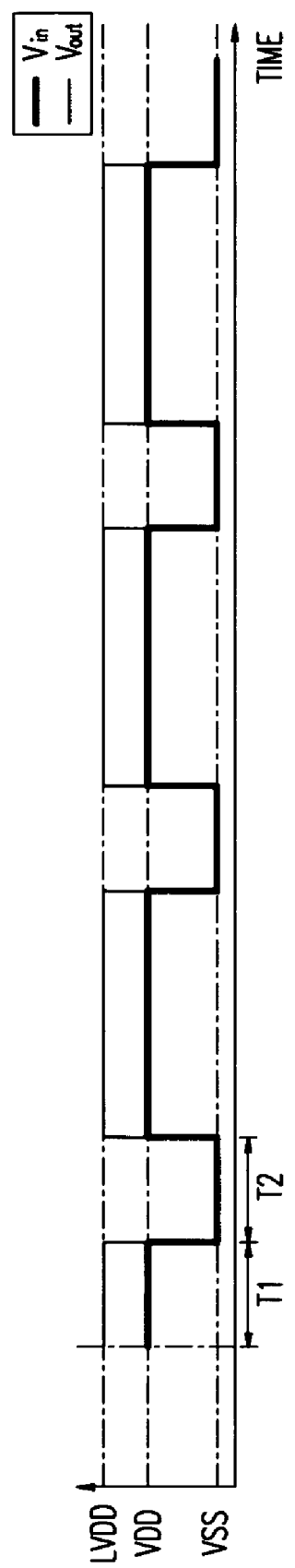
FIG. 4 shows waveforms of a first input voltage Vin and an output voltage Vout of a level shifter according to the first exemplary embodiment of the present invention.

As shown in FIG. 3, the level shifter according to the first exemplary embodiment of the present invention includes transistors M1C, M2C, M3C and a capacitor C1C. According to the first exemplary embodiment of the present invention, the transistors M1C, M3C are P-channel transistors, and the transistor M2C are an N-channel transistor.

The transistors M1C, M2C are coupled to each other in series between a power source for supplying a voltage LVDD and a power source for supplying a voltage VSS. The voltage LVDD is applied to a source of the transistor M1C and a drain of the transistor M1C is coupled to a drain of the transistor M2C. The voltage VSS is applied to a source of the transistor M2C.

A voltage at a node of the drain of the transistor M1C and the drain of the transistor M2C is an output voltage Vout at the level shifter according to the first exemplary embodiment of the present invention.

The transistor M3C is a diode-connected transistor, and a drain of the transistor M3C is coupled to a gate of the transistor M1C. According to the first exemplary embodiment of the present invention, the transistor M3C is forward or reverse biased by a first input voltage Vin, and therefore transmits the first input voltage Vin to the gate of the transistor M1C or blocks the first input voltage Vin.

The capacitor C1C is coupled between the gate of the transistor M1C and a gate of the transistor M2C, and maintains a voltage between the gates of the transistors M1C, M2C.

According to the first exemplary embodiment of the present invention, the first input voltage Vin is applied to a source of the transistor M3C, and a second input voltage Vinb is applied to the gate of the transistor M2C. The second input voltage Vinb is an inverted voltage of the first input voltage Vin.

An operation of the level shifter according to the first exemplary embodiment of the present invention will be described with reference to FIG. 4. The first input voltage Vin alternately has a high-level voltage VDD and a low-level voltage VSS. According to the first exemplary embodiment of the present invention, the high-level voltage VDD is lower than a voltage LVDD. Herein, the voltage VSS may be a ground voltage.

The voltage VDD is assumed such that the transistor M1C is turned on by a difference (VDD−Vt3) between a voltage VDD and an absolute value (Vt3) of a threshold voltage of the transistor M3C as given in Equation 1.

$$VDD-Vt3 < LVDD-Vt1 \qquad \text{[EQUATION 1]}$$

where Vt1 denotes the absolute value of the threshold voltage of the transistor M1C.

The voltage VDD is higher than the threshold voltage Vt3 of the transistor M3C. The voltage VDD is assumed such that the transistor M1C is turned off by a difference value (2VDD−Vt3) between twice the voltage VDD and the threshold voltage Vt3 of the transistor M3C as given in Equation 2.

$$2VDD-Vt3 > LVDD-Vt1 \qquad \text{[EQUATION 2]}$$

When the first input voltage Vin is the high-level voltage VDD in a period of T1, the transistor M3C is forward-biased, and the first input voltage Vin is transmitted to the gate of the transistor M1C. At this time, the transistor M3C is diode-connected, and therefore a voltage applied to the gate of the transistor M1C is given to be a voltage (VDD−Vt3).

As assumed above, the difference (VDD−Vt3) between the voltage VDD and the absolute value (Vt3) of the threshold voltage of the transistor M3C is a value at a level for turning on the transistor M1C, and therefore the transistor M1C is turned on in the period of T1.

The second input voltage Vinb is applied to the gate of the transistor M2C, and the transistor M2C is turned off because the second input voltage Vinb is the low-level voltage VSS.

Accordingly, the output voltage Vout substantially corresponds to the high-level voltage LVDD in the period of T1.

The voltage (VDD−Vt3) is applied to an electrode AC of the capacitor C1C, the voltage VSS is applied to another electrode BC of the capacitor C1C, and therefore, the capacitor C1C is charged with a charge corresponding to a voltage difference between both electrodes.

When the first input voltage Vin becomes the low-level voltage VSS in a period of T2, the transistor M3C is reverse-biased, and the first input voltage Vin is not transmitted to the gate of the transistor M1C. The transistor M2C is turned on because the second input voltage Vinb becomes the high-level voltage VDD.

At this time, the voltage applied to the electrode BC of the capacitor C1C is switched from the low-level voltage VSS to the high-level voltage VDD, and the charge of the capacitor C1C is maintained because the electrode AC is floated (that is, no current flows through the electrode AC). Therefore, a voltage variation value of the electrode BC of the capacitor C1C affects status of the voltage of the electrode AC because the voltages of both terminals are maintained.

That is, when the low-level voltage VSS is a ground voltage, the voltage variation value of the electrode BC of the capacitor C1C is VDD, and therefore the voltage of the electrode AC of the capacitor C1C is increased by the voltage VDD from the voltage (VDD−VT3) in the period of T1.

Accordingly, the voltage applied to the electrode AC of the capacitor C1C is given by Equation 3.

$$V_{CA} = (VDD-Vt3) + VDD = 2VDD - Vt3 \qquad \text{[EQUATION 3]}$$

where $V_{CA}$ denotes a voltage of the electrode AC of the capacitor C1C, and Vt3 denotes an absolute value of the threshold voltage of the transistor M3C.

As described above, the voltage (2VDD−Vt3) is a voltage for turning off the transistor M1C, and therefore the transistor M1C is turned off by the voltage (2VDD−Vt3).

Accordingly, the transistor M2C is turned on, the transistor M1C is turned off, and therefore the output voltage Vout substantially corresponds to the low-level voltage VSS.

The level shifter according to the first exemplary embodiment of the present invention outputs the voltage LVDD when the input voltage Vin is the high-level voltage VDD, and outputs the voltage VSS when the input voltage Vin is the low-level voltage VSS. The voltage LVDD is higher than the voltage VDD, and therefore the level shifter according to the first exemplary embodiment of the present invention is a level-up shifter for increasing the level of the input voltage Vin and outputting the input voltage.

According to the first exemplary embodiment of the present invention, one of the transistors M1C, M2C is interrupted while the level of the first input voltage Vin is converted and the input voltage is output as the output voltage Vout. Therefore, power consumption caused by static currents is not substantially generated and the power consumption of the level shifter is reduced.

The level shifter according to the first exemplary embodiment of the present invention has been described above. The transistor M3C has been described above as a P-channel transistor. However, the invention is not limited to the predetermined channel type of the transistor M3C, and the transistor M3C may also be an N-channel transistor, which will be described in third and a fourth exemplary embodiments. With such a configuration, a leakage current flowing through the transistor M3C is reduced. That is, an increase of the reverse currents according to an increase of the reverse bias voltage is immaterial when an N-channel TFT (thin film transistor) uses an LDD (lightly doped drain) structure. The leakage currents caused by the leakage of charge of the capacitor are reduced when the N-channel TFT is used instead of the P-channel TFT in which the reverse currents are greatly increased according to the increase of the reverse bias voltage.

Figure 5:
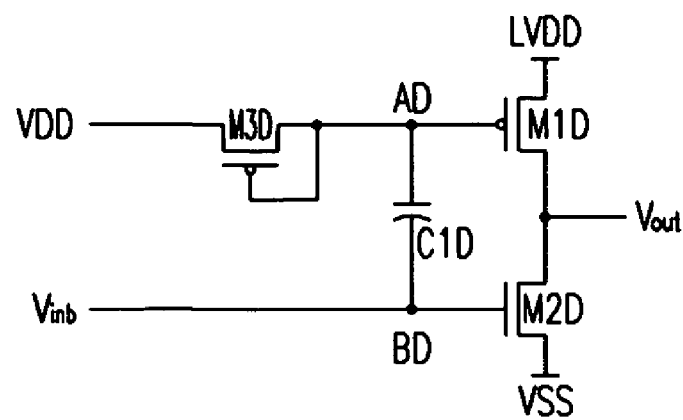
FIG. 5 shows a circuit diagram for representing a level shifter according to a second exemplary embodiment of the present invention.
Figure 6:
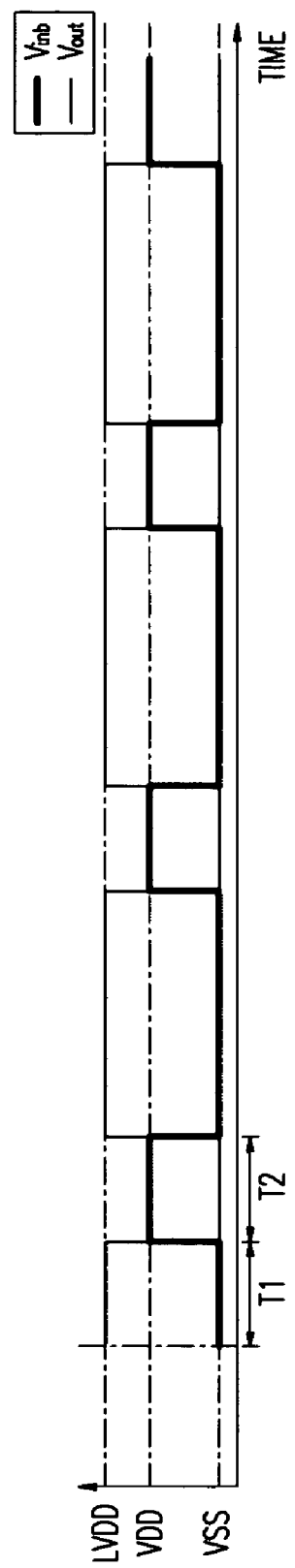
FIG. 6 shows waveforms of a second input voltage Vinb and an output voltage Vout of a level shifter according to the second exemplary embodiment of the present invention.

A level shifter according to a second exemplary embodiment of the present invention will be described with reference to FIG. 5 and FIG. 6. FIG. 5 shows a circuit diagram representing a level shifter according to a second exemplary embodiment of the present invention, and FIG. 6 shows waveforms of a second input voltage Vinb and an output voltage Vout of a level shifter according to the second exemplary embodiment of the present invention.

The level shifter according to the second exemplary embodiment of the present invention is different from the level shifter according to the first exemplary embodiment of the present invention in that the high-level voltage VDD is applied to the source of the transistor M3D.

An operation of the level shifter according to the second exemplary embodiment of the present invention will be described.

The transistor M2D is turned off when the second input voltage Vinb is the low-level voltage VSS. However, the transistor M3D is forward-biased by the high-level voltage VDD, and a voltage corresponding to a difference between the voltage VDD and the absolute value (Vt3) of the threshold voltage of the transistor M3D is applied to the gate of the transistor M1D. Accordingly, the transistor M1D is turned on.

The output voltage Vout of the level shifter according to the second exemplary embodiment of the present invention is the high-level voltage LVDD in the period of T1.

A voltage applied to an electrode AD of the capacitor C1D in the period of T1 is the voltage (VDD−Vt3), and a voltage applied to another electrode BD of the capacitor C1D is the voltage VSS, and therefore the capacitor C1D is charged with charge corresponding to a voltage difference between both electrodes.

The transistor M2D is turned on when the second input voltage Vinb becomes the high-level voltage VDD in a period of T2.

The voltage of the electrode BD of the capacitor C1D is switched from the low-level voltage VSS to the high-level voltage VDD and the charge of the capacitor C1D is maintained because the electrode AD is floated. Accordingly, the voltages of both terminals of the capacitor C1D are maintained, and the voltage of the electrode AD of the capacitor C1D is varied by as much as the voltage variation value of the electrode BD. That is, the voltage variation value of the electrode BD of the capacitor C1D is VDD when the voltage VSS is a ground voltage, and therefore the voltage of the electrode AD of the capacitor C1D is increased by the voltage VDD from the voltage (VDD−Vt3).

Accordingly, the voltage applied to the gate of the transistor M1D reaches (2VDD−Vt3), and the transistor M1D is turned off.

The output voltage Vout of the level shifter in the period of T2 is the low-level voltage VSS.

As described above, the level shifter is operated by the second input voltage Vinb which is the inverted voltage of the first input voltage Vin, and the problem of skew between the first input voltage Vin and the second input voltage Vinb is solved according to the second exemplary embodiment of the present invention. While the level of the second input voltage Vinb is switched to be output as the output voltage Vout, one of the transistors M1D, M2D is interrupted and therefore a path for the static current flow is interrupted. Accordingly, the power consumption of the level shifter is reduced because substantially no power consumption caused by the static currents is generated.

A level shifter according to a third exemplary embodiment of the present invention will be described with reference to FIG. 7 and FIG. 8.

Figure 7:
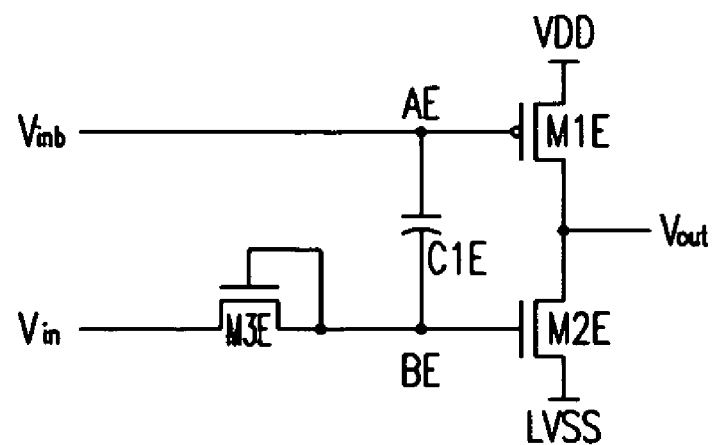
FIG. 7 shows a circuit diagram for representing a level shifter according to a third exemplary embodiment of the present invention.
Figure 8:
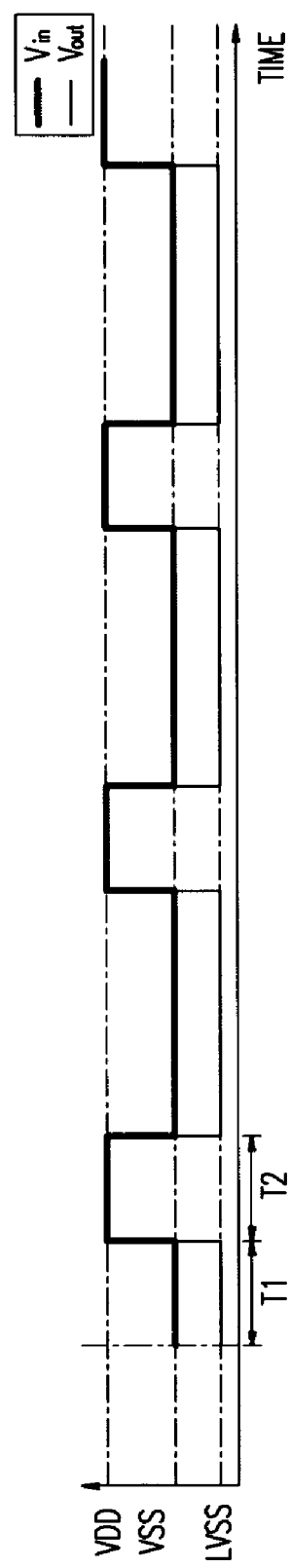
FIG. 8 shows waveforms of a first input voltage Vin and an output voltage Vout of a level shifter according to the third exemplary embodiment of the present invention.

FIG. 7 shows a circuit diagram for representing a level shifter according to a third exemplary embodiment of the present invention, and FIG. 8 shows waveforms of a first input voltage Vin and an output voltage Vout of a level shifter according to the third exemplary embodiment of the present invention.

The level shifter according to the third exemplary embodiment of the present invention is different from the level shifter according to the first exemplary embodiment of the present invention in that the voltage VDD is applied to the source of the transistor M1E, the voltage LVSS is applied to the source of the transistor M2E, and the transistor M3E is coupled to the gate of the transistor M2E. The first input voltage Vin is applied to the source of the transistor M3E, and the second input voltage Vinb is applied to the gate of the transistor M1E.

The voltage LVSS which is a lower voltage than the voltage VSS is assumed to be a voltage such that the transistor M2E is turned on by a sum of the voltage VSS and the threshold voltage Vt3 of the transistor M3E in a like manner of Equation 4.

$$VSS+Vt3>LVSS+Vt2 \qquad [\text{EQUATION 4}]$$

It is assumed that the transistor M2E is turned off by a value obtained by subtracting the voltage VDD from a sum of the voltage VSS and the threshold voltage Vt3 of the transistor M3E in a like manner of Equation 5.

$$VSS+Vt3-TDD<LVSS+Vt2 \qquad [\text{EQUATION 5}]$$

An operation of the level shifter according to the third exemplary embodiment of the present invention will be described with reference to FIG. 8.

The transistor M3E is forward-biased when a first input voltage Vin is a low-level voltage VSS in the period of T1. Accordingly, a voltage (VSS+Vt3) corresponding to the sum of the voltage VSS and the threshold voltage Vt3 of the transistor M3E is applied to the gate of the transistor M2E, and the transistor M2E is turned on as assumed above.

The transistor M1E is turned off when a second input voltage Vinb is the high-level voltage VDD.

Accordingly, the output voltage Vout of the level shifter substantially corresponds to the low-level voltage LVSS in the period of T1.

At this time, the voltage VDD is applied to an electrode AE of the capacitor C1E, the voltage (VSS+Vt3) is applied to another electrode BE, and therefore a charge corresponding to the voltage difference between both electrodes is charged in the capacitor C1E.

When the first input voltage Vin is the high-level voltage VDD in the period of T2, the transistor M3E is reverse-biased, and therefore the first input voltage Vin is not transmitted to the gate of the transistor M2E. The transistor M1 is turned on because the second input voltage Vinb is the low-level voltage VSS.

When the voltage of the electrode AE of the capacitor C1E is switched from the high-level voltage VDD to the low-level voltage VSS, the charge of the capacitor C1E is maintained because the electrode BE is floated (that is, no current flows through the electrode BE). Accordingly, the voltage of the electrode BE of the capacitor C1E is varied corresponding to the voltage variation value of the electrode AE because the voltages of both electrodes are maintained.

In more detail, when the voltage VSS is a ground voltage, the voltage of the electrode BE of the capacitor C1E is reduced by the voltage VDD from the voltage (VSS+Vt3) in the period of T1 because the voltage variation of the electrode AE of the capacitor C1E is −VDD. Therefore, the voltage at the electrode BE of the capacitor C1E is given in Equation 6.

$$V_{CB}=(VSS+Vt3)-VDD=VSS+Vt3-VDD \qquad \text{[EQUATION 6]}$$

where $V_{CB}$ denotes the voltage at the electrode BE of the capacitor C1E.

As assumed above, the transistor M2E is turned off by the voltage $V_{CB}$ of the electrode BE of the capacitor C1E because the transistor M2E is turned off by a level of voltage which is a value obtained by subtracting the voltage VDD from the sum of the voltage VSS and the threshold voltage Vt3 of the transistor M3E.

Accordingly, the level shifter according to the third exemplary embodiment of the present invention outputs the high-level voltage VDD when the first input voltage Vin is a high-level voltage, and outputs the low-level voltage LVSS when the first input voltage Vin is a low-level voltage VSS. The voltage LVSS is lower than the voltage VSS, and therefore the level shifter according to the third exemplary embodiment of the present invention is a level-down shifter.

In the third exemplary embodiment of the present invention, the power consumption of the level shifter is reduced because one of the transistors M1E, M2E is interrupted while the level of the first input voltage Vin is converted and the input voltage is output as an output voltage Vout.

Figure 9:
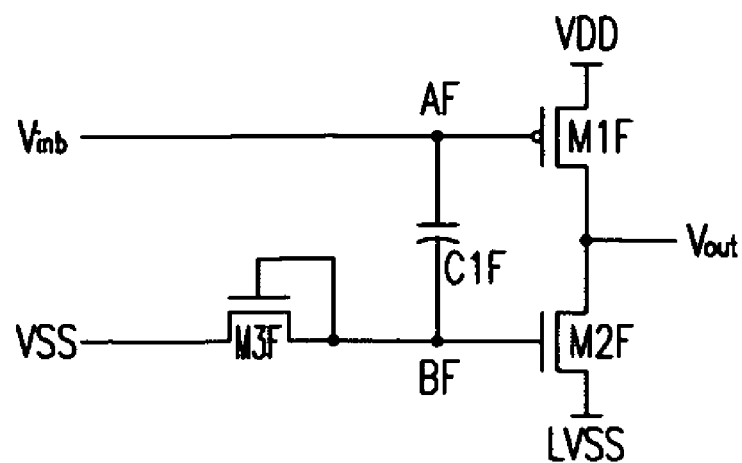
FIG. 9 shows a circuit diagram for representing a level shifter according to a fourth exemplary embodiment of the present invention.
Figure 10:
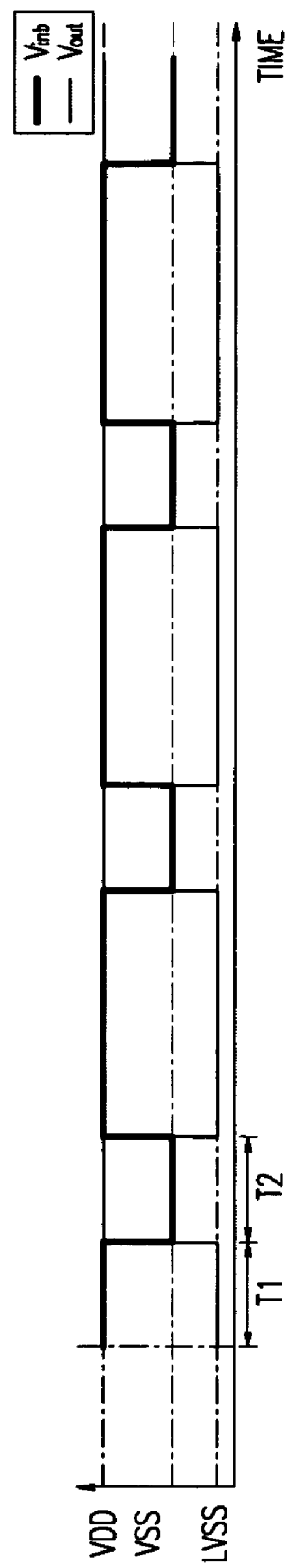
FIG. 10 shows waveforms of a second input voltage Vin and an output voltage Vout of a level shifter according to the fourth exemplary embodiment of the present invention.

FIG. 9 shows a circuit diagram for representing a level shifter according to a fourth exemplary embodiment of the present invention, and FIG. 10 shows waveforms of a second input voltage Vin and an output voltage Vout of a level shifter according to a fourth exemplary embodiment of the present invention.

The level shifter according to the fourth exemplary embodiment of the present invention is different from the level shifter according to the third exemplary embodiment of the present invention because the low-level voltage VSS is applied to the source of the transistor M3F.

Operation of the level shifter according to the fourth exemplary embodiment of the present invention will be described with reference to FIG. 10.

The transistor M1F is turned off when the second input voltage Vin is the high-level voltage VDD in the period of T1.

The transistor M3F is forward-biased by the low-level voltage VSS applied to the source of the transistor M3F. Therefore, a voltage corresponding to the sum of the voltage VSS and the threshold voltage Vt3 of the transistor M3F is applied to the electrode BF of the capacitor C1F, and the transistor M2F is turned on as assumed.

Accordingly, the output voltage Vout of the level shifter according to the fourth exemplary embodiment of the present invention substantially corresponds to the low-level voltage LVSS in the period of T1.

The voltage VDD is applied to the electrode AF of the capacitor C1F, the voltage (VSS+Vt3) is applied to the electrode BF, and therefore a charge corresponding to the voltage difference between both electrodes is charged to the capacitor C1F.

In the period of T2, when the second input voltage Vinb is the low-level voltage VSS, the transistor M1F is turned on and the voltage of the electrode AF of the capacitor C1F is switched from the high-level voltage VDD to the low-level voltage VSS.

When the voltage VSS is assumed to be a ground voltage, the voltage of the electrode AF of the capacitor C1F is reduced by the voltage VDD from the voltage of the electrode AF, and the charge of the capacitor C1F is maintained because the electrode BF is floated (that is, no current flows through the electrode BF). Accordingly, the voltage of the electrode BF of the capacitor C1F is reduced by the voltage VDD from the voltage in the period of T1 because the voltages of both electrodes are maintained. Therefore, the transistor M2F is turned off because the voltage applied to the gate of the transistor M2F is a voltage (VS+Vt3−VDD) and the voltage VDD is higher than the voltage Vt3.

The level shifter according to the fourth exemplary embodiment of the present invention is affected by the second input voltage Vinb. The level shifter according to the fourth exemplary embodiment of the present invention outputs the low-level voltage LVSS when the second input voltage is the high-level voltage, and outputs the high-level voltage VDD when the second input voltage is the low-level voltage.

The level shifter according to the fourth exemplary embodiment of the present invention eliminates the problem of skew between the input voltages by using an input voltage. The power consumption is reduced because one of the transistors M1F and M2F is interrupted while the level of the first input voltage Vin is converted and the input voltage is output as an output voltage Vout.

The level shifters according to the exemplary embodiments of the present invention have been described. The level shifter is applied to a flat panel display using an integrated circuit (IC) of another level of voltage to thus convert a voltage level between the IC and the flat panel display. A flat panel display using the level shifter according to the exemplary embodiment of the present invention will now be described with reference to FIG. 11.

Figure 11:
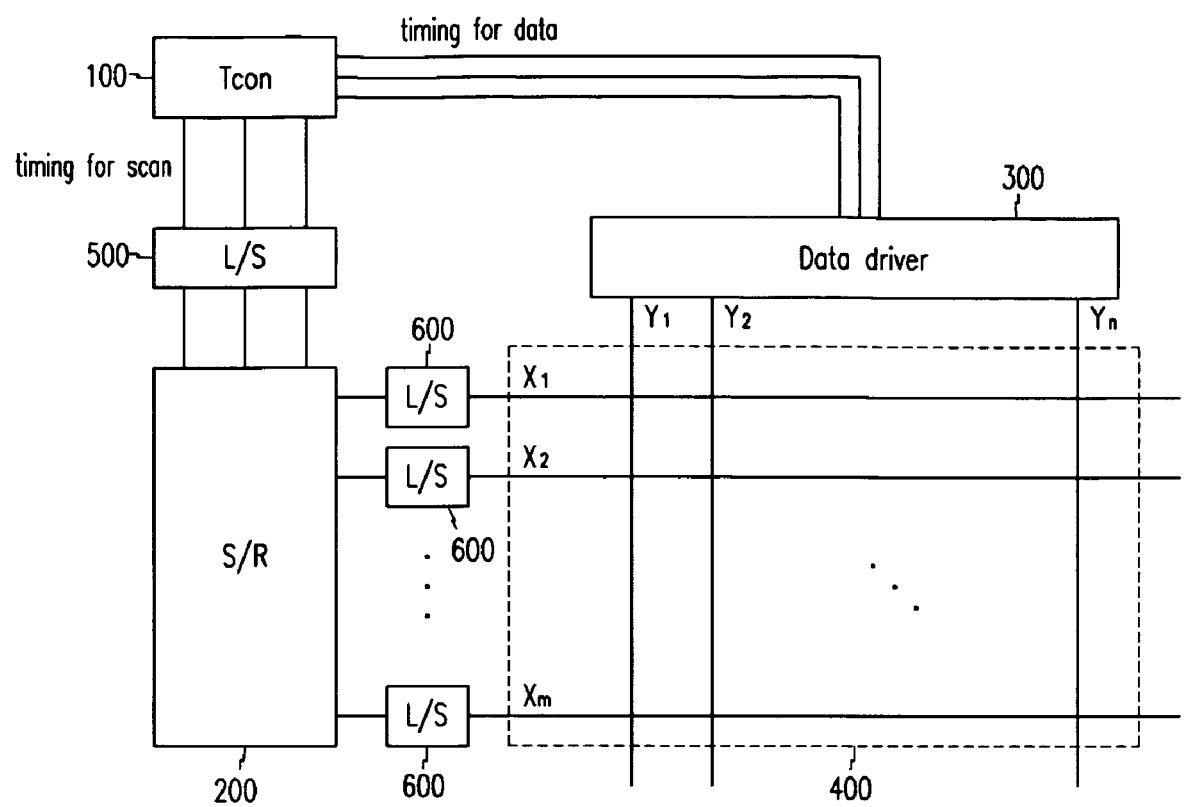
FIG. 11 shows a diagram for representing a flat panel display using the level shifter according to the exemplary embodiments of the present invention.

FIG. 11 shows a diagram for representing a flat panel display using the level shifter according to the exemplary embodiment of the present invention.

The flat panel display shown in FIG. 11 includes a timing controller Tcon 100, a shift register S/R 200, a data driver 300, and a display panel 400. The timing controller 100 generates scan/timing signals and data/timing signals for driving the shift register 200 and the data driver 300, respectively. The shift register 200 receives the scan/timing signals from the timing controller 100 and sequentially applies scan signals to scanning lines X1 to Xm formed on the display panel 400. The data driver 300 applies the data/timing signals to data lines Y1 to Yn on the display panel 400 according to the timing signals.

When the voltage ranges used in the timing controller 100 and the shift register 200 are assumed to be different from each other, a level shifter L/S 500 in accordance with the exemplary embodiments of the present invention described above is formed between the timing controller 100 and the shift register 200, and an output voltage range of the timing controller 100 is converted to a voltage range used in the shift register 200. A buffer (not shown) may be used for the timing signals CLK and /CLK between the level shifter 500 and the shifter register 200.

When the voltage ranges used in the shift register 200 and the display panel 400 are assumed to be different from each other, a level shifter L/S 600 is included between the shift register 200 and the scanning lines X1 to Xm of the display panel 400, and an output voltage range of the shift register 200 is converted to a voltage range used in the display panel 400. A buffer (not shown) operated according to the voltage range used in the display panel 400 may be included between the level shifter 600 and the display panel 400.

It has been exemplified that the level shifters are used between the timing controller 100 and the shift register 200, and between the shift register 200 and the display panel 400 in FIG. 11. In addition, the present invention is not merely limited to the examples described, but can be applied to other flat display configurations in which a voltage range is converted.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A level shifter for receiving an input signal alternately having a first-level voltage and a second-level voltage, and for generating a third-level voltage and a fourth-level voltage according to the first-level voltage and the second-level voltage, comprising:
    a first transistor coupled between a first power source and an output terminal;
    a second transistor coupled between the output terminal and a second power source, in which an inverted signal of the input signal is applied to a gate;
    a capacitor coupled between the first transistor and the gate of the second transistor; and
    a switch for applying a voltage corresponding to the first-level voltage to the gate of the first transistor by responding to the first-level voltage, and for blocking the gate of the first transistor from the input signal by responding to the second-level voltage.

2. The level shifter of claim 1, wherein the switch is coupled to the gate of the first transistor and includes a transistor which is diode-connected to be reverse-biased by the second-level voltage.

3. The level shifter of claim 1, wherein a voltage of the first power source is established to have a higher level than the first-level voltage.

4. The level shifter of claim 3, wherein the voltage of the second power source has a level substantially corresponding to the second-level voltage.

5. The level shifter of claim 4, wherein the first-level voltage is established such that the first transistor is turned on by a difference value between the first-level voltage and an absolute value of a threshold voltage of the switch.

6. The level shifter of claim 4, wherein the first-level voltage is established that the first transistor is turned off by a value obtained by subtracting the absolute value of the threshold voltage of the switch from a sum of the first-level voltage and a fifth-level voltage when a voltage difference between the first-level voltage and the second-level the voltage is the fifth-level voltage.

7. The level shifter of claim 1, wherein the voltage of the second power source substantially corresponds to a ground voltage.

8. A flat panel display comprising:
    a display panel having a plurality of scan lines and a plurality of data lines;
    a shift register for providing scan signals to the scan lines according to timing signal;
    a data driver for providing data signals to the data lines according to the timing signals;
    a controller for generating the timing signals and providing the timing signals to the data driver and the shift register; and
    a level shifter of claim 1 coupled between, at least one of, the controller and the shift register, the shift register and the scan lines, and the controller and the data driver.

9. A level shifter for receiving an input signal alternately having a first-level voltage and a second-level voltage, and for generating a third-level voltage and a fourth-level voltage according to the first-level voltage and the second-level voltage, comprising:
    a first transistor coupled between a first power source and an output terminal, in which an inverted signal of the input signal is applied to a gate;
    a second transistor coupled between the output terminal and a second power source;
    a capacitor coupled between the first transistor and the gate of the second transistor; and
    a switch for blocking the input signal to the gate of the second transistor by responding to the first-level voltage, and for applying a voltage corresponding to the second-level voltage to the gate of the second transistor by responding to the second-level voltage.

10. The level shifter of claim 9, wherein the switch is coupled to the gate of the second transistor and includes a transistor which is diode-connected to be reverse-biased by the first-level voltage.

11. The level shifter of claim 9, wherein a voltage of the second power source is established to be a lower-level voltage than the second-level voltage.

12. The level shifter of claim 11, wherein the voltage of the first power source has a level substantially corresponding to the first-level voltage.

13. The level shifter of claim 12, wherein the second-level voltage is established such that the second transistor is turned on by a sum of the second-level voltage and a threshold voltage of the switch.

14. The level shifter of claim 12, wherein the second-level voltage is established such that the second transistor is turned off by a value obtained by subtracting a fifth-level voltage from the sum of the second-level voltage and the threshold voltage of the switch when a voltage difference between the first-level voltage and the second-level voltage is the fifth-level voltage.

15. A flat panel display comprising:
   a display panel having a plurality of scan lines and a plurality of data lines;
   a shift register for providing scan signals to the scan lines according to timing signal;
   a data driver for providing data signals to the data lines according to the timing signals;
   a controller for generating the timing signals and providing the timing signals to the data driver and the shift register; and
   a level shifter of claim 8 coupled between, at least one of, the controller and the shift register, the shift register and the scan lines, and the controller and the data driver.

16. A level shifter for receiving an input signal alternately having a first-level voltage and a second-level voltage, and for generating a third-level voltage and a fourth-level voltage according to the first-level voltage and the second-level voltage, comprising:
   a first transistor coupled between a first power source and an output terminal;
   a second transistor coupled between the output terminal and a second power source, in which the input signal is applied to a gate;
   a capacitor coupled between the first transistor and the gate of the second transistor; and
   a switch coupled between a third power source and the gate of the first transistor, for applying a voltage corresponding to the voltage of the third power source to the gate of the first transistor in a period when the input signal is the first-level voltage, and for blocking the third power source to the gate of the first transistor in a period when the input signal is the second-level voltage.

17. The level shifter of claim 16, wherein the switch is coupled to the gate of the first transistor and includes a transistor which is diode-connected to be reverse-biased in a period when the input signal is the second-level voltage.

18. The level shifter of claim 16, wherein the voltage of the first power source is higher than the voltage of the second power source and the voltage of the second power source has a level substantially corresponding to the first-level voltage.

19. The level shifter of claim 18, wherein the voltage of the first power source is higher than the second-level voltage and the voltage of the third power source has a level substantially corresponding to the second-level voltage.

20. The level shifter of claim 18, wherein the second-level voltage is established such that the first transistor is turned on by a difference value between the second-level voltage and the absolute value of the threshold voltage of the switch.

21. The level shifter of claim 20, wherein the second-level voltage is established such that the first transistor is turned off by a value obtained by subtracting the absolute value of the threshold voltage of the switch from a sum of the second-level voltage and a fifth-level voltage when a difference between the first-level voltage and the second-level voltage is the fifth-level voltage.

22. The level shifter of claim 16, wherein the voltage of the first power source is lower than the voltage of the second power source and the voltage of the second power source has a level substantially corresponding to the first-level voltage.

23. The level shifter of claim 22, wherein the voltage of the first power source is lower than the second-level voltage and the voltage of the third power source has a level substantially corresponding to the second-level voltage.

24. The level shifter of claim 23, wherein the second-level voltage is established such that the first transistor is turned on by the sum of the second-level voltage and the threshold voltage of the switch.

25. The level shifter of claim 24, wherein the second-level voltage is established such that the first transistor is turned off by a value obtained by subtracting a fifth-level voltage from the sum of the second-level voltage and the threshold voltage of the switch when a difference between the first-level voltage and the second-level voltage is the fifth-level voltage.

26. A flat panel display comprising:
   a display panel having a plurality of scan lines and a plurality of data lines;
   a shift register for providing scan signals to the scan lines according to timing signal;
   a data driver for providing data signals to the data lines according to the timing signals;
   a controller for generating the timing signals and providing the timing signals to the data driver and the shift register; and
   a level shifter of claim 14 coupled between, at least one of, the controller and the shift register, the shift register and the scan lines, and the controller and the data driver.

* * * * *